US012756387B2

(12) United States Patent
Weiß et al.

(10) Patent No.: US 12,756,387 B2
(45) Date of Patent: Oct. 6, 2026

(54) ASYMMETRIC POWER MODULE

(71) Applicant: Infineon Technologies AG, Neubiberg (DE)

(72) Inventors: Peter Weiß, Kelheim (DE); Christoph Bauer, Regensburg (DE); Christian Novak, Remseck am Neckar (DE)

(73) Assignee: Infineon Technologies AG, Neubiberg (DE)

( * ) Notice: Subject to any disclaimer, the term of this patent is extended or adjusted under 35 U.S.C. 154(b) by 188 days.

(21) Appl. No.: 18/747,785

(22) Filed: Jun. 19, 2024

(65) Prior Publication Data

US 2024/0429915 A1 Dec. 26, 2024

(30) Foreign Application Priority Data

Jun. 21, 2023 (DE) ......................... 102023116324.8

(51) Int. Cl.
*H03K 17/16* (2006.01)
*H03K 17/0812* (2006.01)

(52) U.S. Cl.
CPC ....... *H03K 17/163* (2013.01); *H03K 17/0812* (2013.01)

(58) Field of Classification Search
CPC ... H03K 17/163; H03K 17/0812; H02M 1/00; H02M 7/003; H02M 7/5388
USPC .......................................................... 327/419
See application file for complete search history.

(56) References Cited

U.S. PATENT DOCUMENTS

| | | | | |
|---|---|---|---|---|
| 7,737,666 B2 * | 6/2010 | Sutardja | H02M 3/1588 | 323/224 |
| 10,298,427 B2 * | 5/2019 | Uozumi | H02M 1/08 | |
| 12,540,975 B2 * | 2/2026 | Aherne | G01R 31/31924 | |
| 2005/0256921 A1 * | 11/2005 | Amekawa | G06F 30/367 | 708/800 |
| 2007/0126476 A1 * | 6/2007 | Nakashima | H10D 84/83 | 326/62 |
| 2007/0176683 A1 * | 8/2007 | Oba | H03G 1/007 | 330/278 |
| 2009/0302805 A1 * | 12/2009 | Motoichi | H02J 7/00 | 320/164 |
| 2013/0016542 A1 | 1/2013 | Nakamura et al. | | |
| 2015/0171859 A1 * | 6/2015 | Pisau | H03K 17/165 | 327/379 |
| 2017/0287721 A1 * | 10/2017 | Wood | H10P 50/613 | |
| 2017/0346666 A1 * | 11/2017 | Uozumi | H02M 3/158 | |
| 2018/0309433 A1 | 10/2018 | Volke et al. | | |

(Continued)

*Primary Examiner* — Ryan Jager
(74) *Attorney, Agent, or Firm* — Slater Matsil, LLP

(57) ABSTRACT

In accordance with an embodiment, power module includes a module control terminal, a first module load terminal and a second module load terminal and at least one power switch comprising a plurality of switching devices coupled in parallel. Each switching device comprises a control terminal, a first load terminal and a second load terminal. The control terminals are coupled to the module control terminal via a plurality of control paths, the first load terminals are coupled to the first module load terminal via a plurality of first load paths, and the second load terminals are coupled to the second module load terminal via a plurality of second load paths. A control path, a first load path or a second load path has at least one electrical parameter respectively differing from the other control paths, other first load paths and other second load paths.

20 Claims, 6 Drawing Sheets

(56) References Cited

U.S. PATENT DOCUMENTS

| | | | | |
|---|---|---|---|---|
| 2018/0351546 | A1* | 12/2018 | Horváth | H03K 17/284 |
| 2019/0341841 | A1* | 11/2019 | Dickey | H02M 3/1584 |
| 2021/0083661 | A1* | 3/2021 | Nagasawa | H03K 17/161 |
| 2023/0347717 | A1* | 11/2023 | Shen | F24H 3/0429 |
| 2023/0361771 | A1* | 11/2023 | Prasad | H03K 17/687 |
| 2024/0429915 | A1* | 12/2024 | Weiß | H03K 17/0812 |
| 2025/0392304 | A1* | 12/2025 | Puukko | H03K 17/04123 |

* cited by examiner

ASYMMETRIC POWER MODULE

This application claims the benefit of German Patent Application No. 102023116324.8, filed on Jun. 21, 2023, which application is hereby incorporated herein by reference.

TECHNICAL FIELD

The invention generally relates to power modules including one or more power switches and more precisely to the reduction of stress during switching of the power module caused at a load coupled to the power module.

BACKGROUND

A power module comprises one or more power switches, which are generally provided as one or more pluralities of switching devices coupled in parallel. To interface with control circuitry and a load, the power module comprises module terminals coupled internally to control terminals, first load terminals and second load terminals of the one or more power switches. These internal connections between control terminals, first load terminals and second load terminals and module terminals are formed with pluralities of respective paths. The pluralities of paths are typically designed to be symmetric, i.e. to exhibit identical or substantially identical electric properties. The paths are typically designed to be symmetric in order to reduce oscillations inside the power module. However, the symmetric design causes long ringing phases after a switching event, which may in particular cause excessive slew rates, as e.g. illustrated in FIG. 6A. Excessive slew rates may lead to a lifetime degradation of the load coupled to the power module, e.g. by continuously damaging the insulation of wiring of the load.

SUMMARY OF THE INVENTION

To achieve this objective, the present disclosure provides a power module. The power module comprises a module control terminal, a first module load terminal and a second module load terminal; and at least one power switch comprising a plurality of switching devices coupled in parallel. Each switching device comprises a control terminal, a first load terminal and a second load terminal. The control terminals of the plurality of switching devices are coupled to the module control terminal via a plurality of control paths. The first load terminals of the plurality of switching devices are coupled to the first module load terminal via a plurality of first load paths. The second load terminals of the plurality of switching devices are coupled to the second module load terminal via a plurality of second load paths. At least one of a control path of the plurality of control paths, a first load path of the plurality of first load paths and a second load path of the plurality of second load paths has at least one electrical parameter respectively differing from the other control paths of the plurality of control paths, the other first load paths of the plurality of first load paths and the other second load paths of the plurality of second load paths.

BRIEF DESCRIPTION OF THE DRAWINGS

Examples of the present disclosure will be described with reference to the following appended drawings, in which like reference signs refer to like elements.

Figure 1:
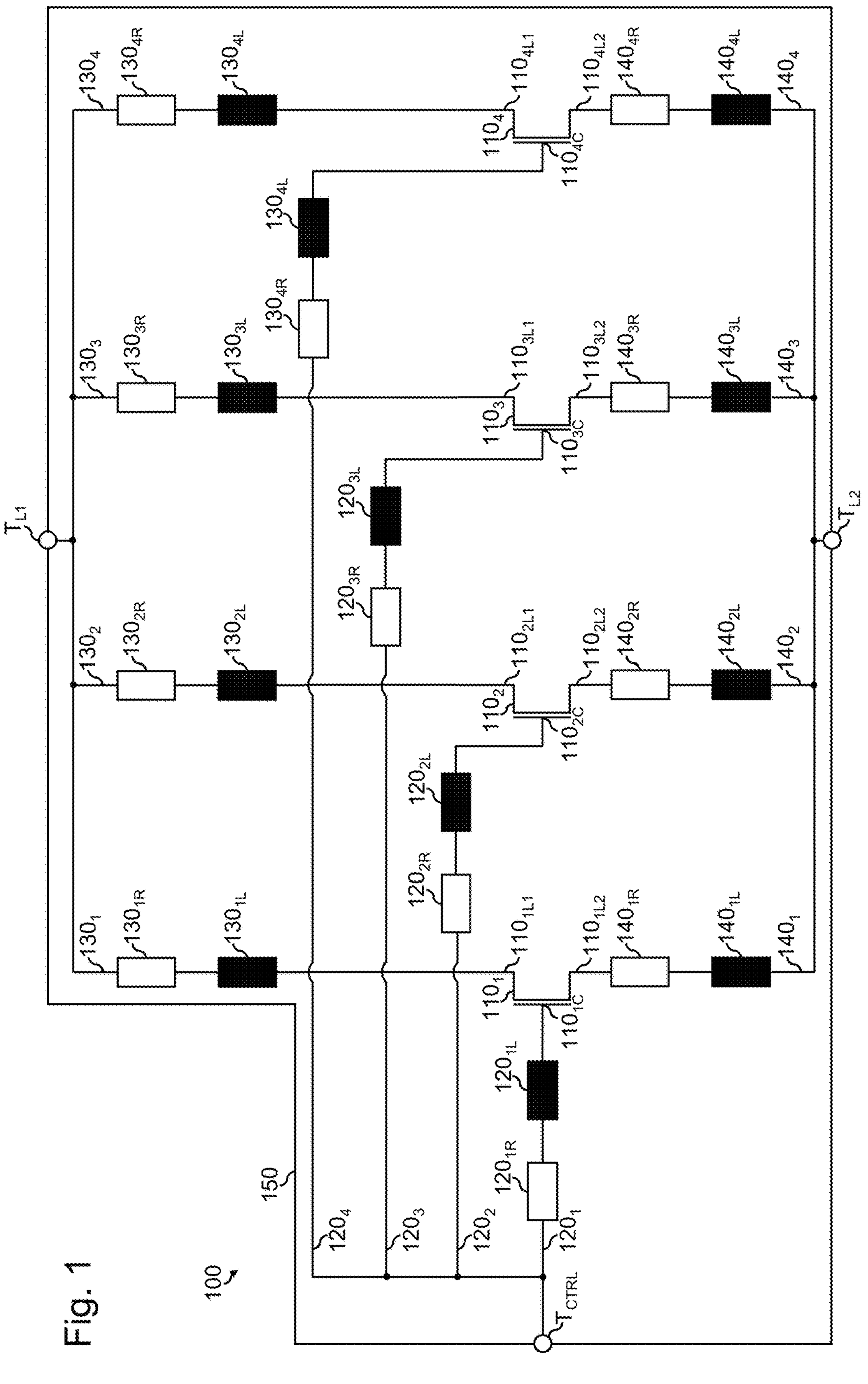
FIG. 1 provides an equivalent circuit diagram of a power module according to examples of the present disclosure.

It should be understood that the above-identified drawings are in no way meant to limit the present disclosure. Rather, these drawings are provided to assist in understanding the present disclosure. The person skilled in the art will readily understand that aspects of the present invention shown in one drawing may be combined with aspects in another drawing or may be omitted without departing from the scope of the present disclosure.

DETAILED DESCRIPTION OF ILLUSTARTIVE EMBODIMENTS

The present disclosure generally provides a power module with at least one asymmetric path between at least one of the terminals of the power module and at least one of the terminals of one of a plurality of parallel switching devices forming a power switch of the power module. Using a power module comprising a single power switch as an example, such a power module may comprise a module control terminal, a first module load terminal and a second module load terminal. The single power switch may e.g. be implemented by four switching devices in parallel, each switching device having a control terminal, a first load terminal and a second load terminal. Accordingly, a total of twelve paths exists inside the power module made up of three groups of paths: four paths between the module control terminal and the respective control terminals, four paths between the first module load terminal and the respective first load terminals and four paths between the second module load terminal and the respective second load terminals. In at least one of the three groups of paths, one path is asymmetric with regard to the other three paths, i.e. said path differs from the other three with regard to at least one electric parameter, such as a resistance or an inductance. Accordingly, in the example of twelve paths made up of three groups of four paths, at least one group includes a path differing with regard to at least one electric parameter from the other three paths. It will be understood that this constitutes a minimum level of asymmetry. In other words, in some examples of the power module having a single switch, each group of paths may include an asymmetric path or two groups may include an asymmetric path and the third group may not include an asymmetric path. At a maximum level of asymmetry, all paths within each group of paths may differ from one another, i.e. within each of the three groups, all four paths may differ from one another with regard to at least one electric parameter. Thus, the number of paths differing from other paths within each group of paths may vary between these two extrema.

The concept of having at least one asymmetric path in at least one group or plurality of paths discussed with regard to the exemplary power module with a single power switch may be applied to any power module with any number of switches formed by any number of parallel switching devices. Examples include half-bridges, inverters or multi-level inverters, in which each power switch may for example be formed by ten parallel switching devices.

Figure 2:
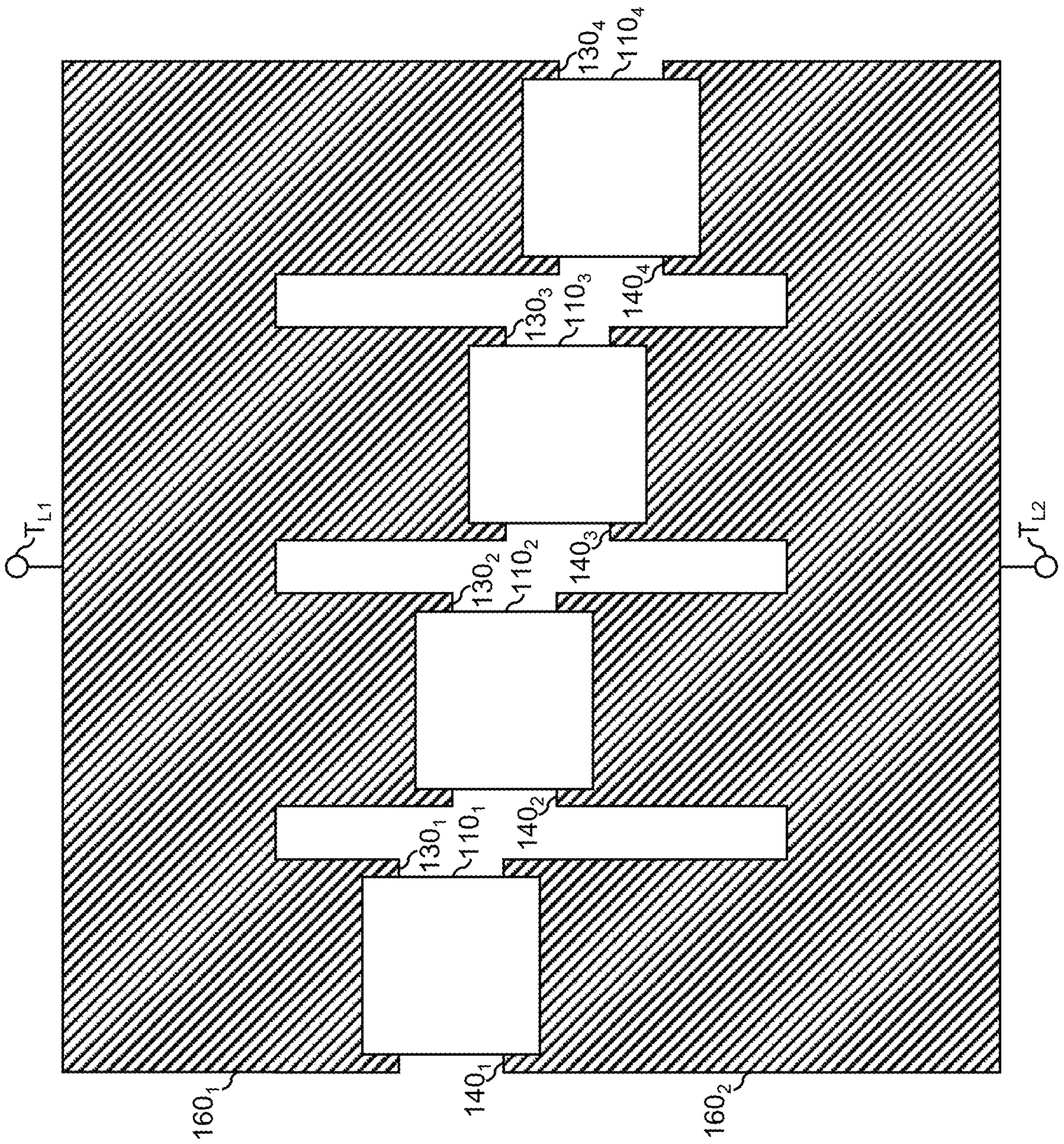
FIG. 2 illustrates an example of a power substrate layer of the power module according to examples of the present disclosure.
Figure 3:
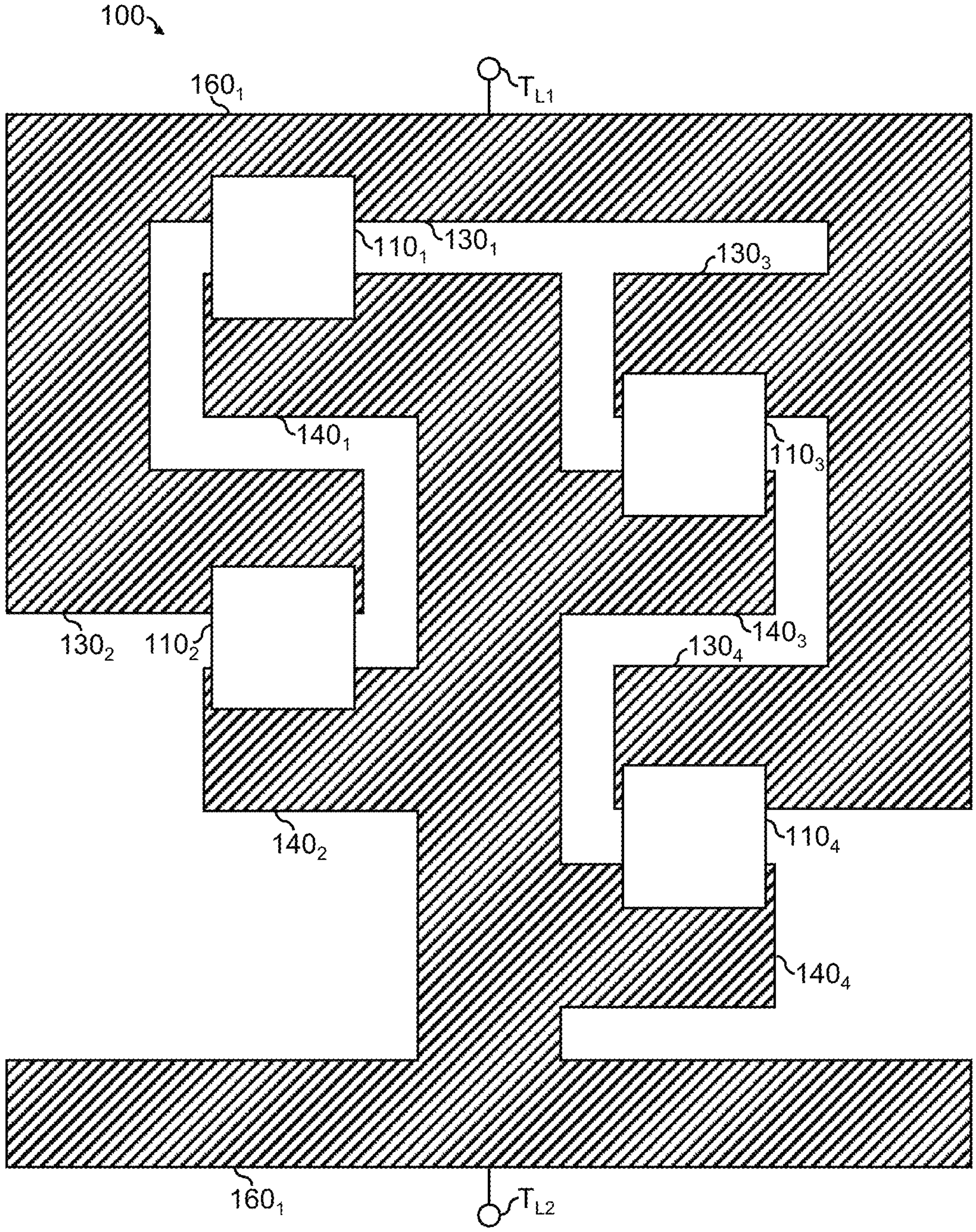
FIG. 3 illustrates an example of a power substrate layer of the power module according to examples of the present disclosure.
Figure 4:
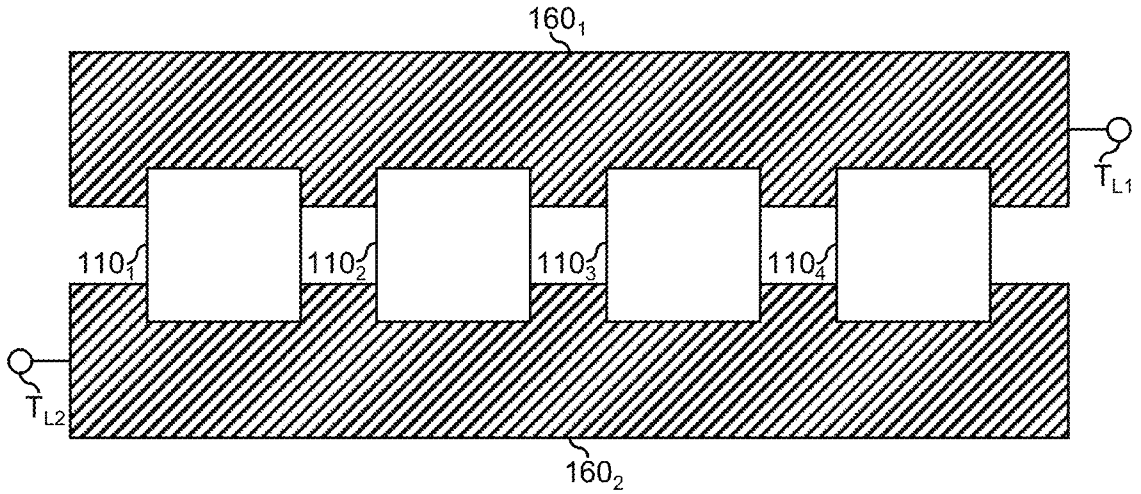
FIG. 4 illustrates an example of a power substrate layer of the power module according to examples of the present disclosure.

This general concept will be explained with reference to the appended drawings, with FIG. 1 providing an equivalent circuit of a power module and FIGS. 2 to 4 illustrating various examples of how to achieve asymmetric paths. FIGS. 5A to 6B illustrate the effect of the power module in accordance with the present disclosure on the slew rate and the load path voltage during switching of the power module in accordance with the present disclosure compared to a power module without asymmetric paths.

FIG. 1 illustrates an equivalent circuit of a power module 100. Power module 100 includes a module control terminal $T_{CTRL}$, a first module load terminal $T_{L1}$ and a second module load terminal $T_{L2}$. Module control terminal $T_{CTRL}$ is configured to be coupled to control circuitry, such as a gate driver. First module load terminal $T_{L1}$ and second module load terminal $T_{L2}$ are respectively configured to be coupled to any type of electric components, such as a supply voltage, a further power module, a load or other electronic components, as warranted by the intended use of power module 100. Module control terminal $T_{CTRL}$, first module load terminal $T_{L1}$ and second module load terminal $T_{L2}$ may be arranged on or be integrated into a housing 150. Housing 150 may be any type of housing suitable to enclose the components of power module 100 while taking thermal aspects, environmental aspects, such as moisture levels, and safety aspects, such as creepage distance, into account.

Power module 100 further comprises at least one power switch. Depending on the power circuitry implemented by power module 100, power module 100 may include any number of power switches, such as four if power module 100 implements an H-bridge or 18 if power module 100 implements a three-level inverter. The power switch may be any kind of power switch configured to have a high voltage blocking capability. For example, the power switch may be able to block voltages above at least 400 V, such as 450 V, 900 V, 1,200 V, 1,800 V or 3,300 V. To achieve such voltage blocking capabilities, the power switch may for example be a silicon or silicon carbide (SiC) metal oxide field effect transistor (MOSFET), a silicon or SiC insulated gate bipolar transistor (IGBT) or a Gallium nitride high electron mobility transistor (GaN-HEMT). It will be understood that both the voltage levels and the technology types discussed with regard to the power switch are merely provided as an example. The present disclosure may be practiced with other high voltage levels and other power switch technologies than those mentioned here.

The at least one power switch comprises a plurality of switching devices 110 coupled in parallel. In the example of FIG. 1, plurality of switching devices 110 includes four switching devices $\mathbf{110}_1$ to $\mathbf{110}_4$. It will be understood that the number of switching devices shown in the equivalent circuit of FIG. 1 is merely provided as an example. The power switch may for example comprise 10 or 100 switching devices coupled in parallel.

Each one of switching devices $\mathbf{110}_1$ to $\mathbf{110}_4$ comprises a control terminal $\mathbf{110}_{1C}$ to $\mathbf{110}_{4C}$, a first load terminal $\mathbf{110}_{1L1}$ to $\mathbf{110}_{4L1}$ and a second load terminal $\mathbf{110}_{1L2}$ to $\mathbf{110}_{4L2}$. Control terminals $\mathbf{110}_{1C}$ to $\mathbf{110}_{4C}$, first load terminals $\mathbf{110}_{1L1}$ to $\mathbf{110}_{4L1}$ and second load terminals $\mathbf{110}_{1L2}$ to $\mathbf{110}_{4L2}$ may, depending on the technology used to implement the power switch, be respectively referred to as a gate terminal or a base terminal, a drain terminal or collector terminal, and a source terminal or a emitter terminal. It will be understood that module control terminal $T_{CTRL}$, first module load terminal $T_{L1}$ and second module load terminal $T_{L2}$ may accordingly be respectively referred to as a module gate terminal or a module base terminal, a module drain terminal or module collector terminal, and a module source terminal or a module emitter terminal, depending on the technology used to implement the power switch.

Control terminals $\mathbf{110}_{1C}$ to $\mathbf{110}_{4C}$ of plurality of switching devices 110 are coupled to the module control terminal $T_{CTRL}$ via a plurality of control paths 120, which in the example of FIG. 1 includes four control paths $\mathbf{120}_1$ to $\mathbf{120}_4$. First load terminals $\mathbf{110}_{1L1}$ to $\mathbf{110}_{4L1}$ of the plurality of switching devices 110 are coupled to the first module load terminal $T_{L1}$ via a plurality of first load paths 130, which in the example of FIG. 1 includes four first load paths $\mathbf{130}_1$ to $\mathbf{130}_4$. Second load terminals $\mathbf{110}_{1L2}$ to $\mathbf{110}_{4L2}$ of the plurality of switching devices 110 are coupled to second module load terminal $T_{L2}$ via a plurality of second load paths 140, which in the example of FIG. 1 includes four first load paths $\mathbf{140}_1$ to $\mathbf{140}_4$. It will be understood that plurality of control paths 120, plurality of first load paths 130 and plurality of second load paths 140 may also be referred to based on the technology-dependent designators discussed above.

At least one of control paths $\mathbf{120}_1$ to $\mathbf{120}_4$ of plurality of control paths 120, first load paths $\mathbf{130}_1$ to $\mathbf{130}_4$ of plurality of first load paths 130 and second load paths $\mathbf{140}_1$ to $\mathbf{140}_4$ of plurality of second load paths 140 has at least one electrical parameter respectively differing from the other control paths $\mathbf{120}_1$ to $\mathbf{120}_4$ of the plurality of control paths 120, the other first load paths $\mathbf{130}_1$ to $\mathbf{130}_4$ of the plurality of first load paths 130 and the other second load paths $\mathbf{140}_1$ to $\mathbf{140}_4$ of the plurality of second load paths 140. The differing at least one electrical parameter causes at least one path of plurality of control paths 120, plurality of first load paths 130 and plurality of second load paths 140 to be asymmetric with regard to the other paths of the respective plurality of paths.

To illustrate the difference in at least one electrical parameter, control paths $\mathbf{120}_1$ to $\mathbf{120}_4$, first load paths $\mathbf{130}_1$ to $\mathbf{130}_4$ and second load paths $\mathbf{140}_1$ to $\mathbf{140}_4$ are shown in FIG. 1 as respectively comprising control path resistors $\mathbf{120}_{1R}$ to $\mathbf{120}_{4R}$, control path inductors $\mathbf{130}_{1L}$ to $\mathbf{130}_{4L}$, first load path resistors $\mathbf{130}_{1R}$ to $\mathbf{130}_{4R}$, first load path inductors $\mathbf{130}_{1L}$ to $\mathbf{130}_{4L}$ second load path resistors $\mathbf{140}_{1R}$ to $\mathbf{140}_{4R}$ and second load path inductors $\mathbf{140}_{1L}$ to $\mathbf{140}_{4L}$. Each resistor and inductor respectively represents a resistance value and an inductance value of the corresponding path. The resistance value and/or the inductance value of any path may differ from the resistance value and/or inductance value of the other paths of the corresponding plurality of paths.

To use plurality of second load paths 140 as an example, the resistance value of second load path $\mathbf{140}_3$ as illustrated by resistor $\mathbf{140}_{3R}$ and/or the inductance value of second load path $\mathbf{140}_3$ as illustrated by inductor $\mathbf{140}_{3L}$ may differ from the resistance value and/or inductance value of second load paths $\mathbf{140}_1$, $\mathbf{140}_2$ and $\mathbf{140}_3$. In other words, in this example resistors $\mathbf{140}_{1R}$, $\mathbf{140}_{2R}$ and $\mathbf{140}_{4R}$ and inductors $\mathbf{140}_{1L}$, $\mathbf{140}_{2L}$ and $\mathbf{140}_{L4}$ are identical. Further, in this example control paths $\mathbf{120}_1$ to $\mathbf{120}_4$ of the plurality of control paths 120 and first load paths $\mathbf{130}_1$ to $\mathbf{140}_4$ of the plurality of first control paths 130 have identical resistance values and inductance values within their respective plurality of paths, i.e. resistors $\mathbf{120}_{1R}$ to $\mathbf{120}_{4R}$ and inductors $\mathbf{120}_{1L}$ to $\mathbf{120}_{4L}$ as well as resistors $\mathbf{130}_{1R}$ to $\mathbf{130}_{4R}$ and inductors $\mathbf{130}_{1L}$ to $\mathbf{130}_{4L}$ are respectively identical. However, resistors $\mathbf{120}_{1R}$ to $\mathbf{120}_{4R}$ and resistors $\mathbf{130}_{1R}$ to $\mathbf{130}_{4R}$ as well as inductors $\mathbf{120}_{1L}$ to $\mathbf{120}_{4L}$ and inductors $\mathbf{130}_{1L}$ to $\mathbf{130}_{4L}$ may or may not be identical, since any difference or equality between electrical parameters of different pluralities of paths does not affect the asymmetry of power module 100 in the context of the present disclosure. Accordingly, in this example control path $\mathbf{140}_3$ differs with regard to the resistance value and/or the inductance value from the other control paths of plurality of control paths 140 in FIG. 1 while the other paths in FIG. 1 do not differ with regard to the resistance value and the inductance value from the other paths of the respective plurality of paths. This example may be considered to represent a minimum level of asymmetry. It will be understood that at the minimum level of asymmetry, the differing path may also be one of the control paths $\mathbf{120}_1$ to $\mathbf{120}_4$ or one of first load terminals $\mathbf{130}_1$ to $\mathbf{130}_4$.

In a further example, the resistance value and/or inductance value of all paths of all pluralities of paths may differ. In other words, resistors $\mathbf{120}_{1R}$ to $\mathbf{120}_{4R}$ and/or inductors $\mathbf{130}_{1L}$ to $\mathbf{130}_{4L}$, resistors $\mathbf{130}_{1R}$ to $\mathbf{130}_{4R}$ and/or inductors $\mathbf{140}_{1L}$ to $\mathbf{140}_{4L}$ and resistors $\mathbf{140}_{1R}$ to $\mathbf{140}_{4R}$ and/or inductors $\mathbf{140}_{1L}$ to $\mathbf{140}_4$ differ from one another. This example represents a maximum level of asymmetry.

For each power switch of power module 100, the various paths discussed above may be implemented with at least one differing electric parameter between the minimum level of asymmetry and the maximum level of asymmetry. For example, all control paths $\mathbf{120}_1$ to $\mathbf{120}_4$ may differ with regard to their resistance value and/or inductance value, first load path $\mathbf{130}_2$ may differ from the other first load paths $\mathbf{130}_1$, $\mathbf{130}_3$ and $\mathbf{130}_4$ and second load paths $\mathbf{140}_1$ to $\mathbf{140}_4$ may be identical. For example, within each plurality of paths of FIG. 1, the paths may differ from one another pairwise, with e.g. identical control paths $\mathbf{120}_1$ and $\mathbf{120}_3$ differing with regard to at least one electrical parameter from identical control paths $\mathbf{120}_2$ and $\mathbf{120}_4$, identical first load paths $\mathbf{130}_1$ and $\mathbf{130}_3$ differing with regard to at least one electrical parameter from identical first load paths $\mathbf{130}_2$ and $\mathbf{130}_4$ and identical second load paths $\mathbf{140}_1$ and $\mathbf{140}_3$ differing with regard to at least one electrical parameter from identical second load paths $\mathbf{140}_2$ and $\mathbf{140}_4$.

It will be understood that the resistors and inductors shown in FIG. 1 are merely provided to represent resistance and inductance values and are not intended to indicate the presence of discrete resistors and inductors in the various paths. While discrete resistors and inductors may be used to adjust electrical parameters of the various paths, as will be discussed in the following, electrical parameters of the various paths may also be adjusted by other means which affect electrical parameters of the various paths without using discrete elements, which will likewise be discussed in the following. It will further be understood that resistance and inductance values are merely provided as example electrical parameters and that other electrical parameters of at least one path may differ from the corresponding other electrical parameters of the other paths of the respective plurality of paths in order to achieve the desired level of asymmetry. For example, the differing electrical parameter may be a capacitance value.

To implement the at least one path having an electric parameter differing from the other paths of the respective plurality of paths as discussed above, power module 100 may include a substrate layer 160, which will be discussed in the following with reference to FIGS. 2 to 4, which represent implementations of the equivalent circuit of power module 100 of FIG. 1.

Substrate layer 160 may be configured to form at least a part of the various paths discussed above. In the examples of FIGS. 2 to 4, first load paths $\mathbf{130}_1$ to $\mathbf{130}_4$ and second load paths $\mathbf{140}_1$ to $\mathbf{140}_4$ are formed on power substrate 160. Substrate layer 160 may for example be a direct copper bonded substrate (DBC) or a lead frame or any other type of conductive layer enabling the formation of the various signal paths of power module 100.

Substrate layer 160 may comprise a first section $\mathbf{160}_1$ and a second section $\mathbf{160}_2$. First section $\mathbf{160}_1$ and a second section $\mathbf{160}_2$ may be separate from one another, as shown by a gap between first section $\mathbf{160}_1$ and second section $\mathbf{160}_2$ in FIGS. 2 to 4. Plurality of first load paths 130 may be formed at least in part on first section $\mathbf{160}_1$ and plurality of second load paths 140 may be formed at least in part on second section $\mathbf{160}_2$. Accordingly, the separation of first section $\mathbf{160}_1$ from second section $\mathbf{160}_2$ provides an insulation between the plurality of first load paths 130 and plurality of second load paths 140. Switching devices $\mathbf{110}_1$ to $\mathbf{110}_4$ are shown in FIGS. 2 to 4 as dies arranged across the separation, i.e. switching devices $\mathbf{110}_1$ to $\mathbf{110}_4$ may couple plurality of first load paths 130 and plurality of second load paths 140 with one another, as also shown in the equivalent circuit of FIG. 1.

Each first load path $\mathbf{130}_1$ to $\mathbf{130}_4$ has a path length along first section $\mathbf{160}_1$. Likewise, each second load path $\mathbf{140}_1$ to $\mathbf{140}_4$ has a path length along second section $\mathbf{160}_2$. At least one path length of at least one path of at least one of plurality of first load paths 130 and of plurality of second load paths 140 has a length respectively differing from the path lengths of the other first load paths of plurality of first load paths 130 and of the other second load paths of the plurality of second load paths 140. In other words, the path lengths of first load paths $\mathbf{130}_1$ to $\mathbf{130}_4$ and the path lengths of first load paths $\mathbf{140}_1$ to $\mathbf{140}_4$ along power substrate 160 may be used to implement the difference in electrical parameters and thus the asymmetry between the paths in power module 100 discussed above. This may be due to the fact that a longer path length along power substrate 160 may lead to a higher inductance value, higher capacitance value and/or higher resistance or to a change in any other electrical parameter, which may be affected by a longer signal path along power substrate 160. Referring to the minimum level of asymmetry and the maximum level of asymmetry discussed above, at a minimum one path length may differ from the path lengths of the other paths of the corresponding plurality of paths. At a maximum, all path lengths within a plurality of paths may differ. FIGS. 2 to 4 illustrate three examples of the latter.

In the example of FIG. 2, first section $\mathbf{160}_1$ and second section $\mathbf{160}_2$ respectively comprise a first plurality of coupling structures and a second plurality of coupling structures. Both the first plurality of coupling structures and the second plurality of coupling structures may extend in parallel. Such an arrangement of the first plurality of coupling structures and the second plurality of coupling structures may lead to a comb-like shape of first section $\mathbf{160}_1$ and second section $\mathbf{160}_2$, as shown in FIG. 2. Plurality of load paths 130 may be formed at least in part on the first plurality of coupling structures. As shown in FIG. 2, first load paths $\mathbf{130}_1$ to $\mathbf{130}_4$ are arranged from left to right on the parallel coupling structures of the first plurality of coupling structures. Likewise, plurality of load paths 140 may be formed at least in part on the second plurality of coupling structures. As shown in FIG. 2, second load paths $\mathbf{140}_1$ to $\mathbf{140}_4$ are arranged from left to right on the parallel coupling structures of the second plurality of coupling structures. At least one coupling structure of at least one of the first plurality of coupling structures and the second plurality of coupling structures has a length respectively differing from lengths of the other coupling structures of the first plurality of coupling structures and of the second plurality of coupling structures. In other words, in the example of first section $160_1$ and second section $160_2$ respectively comprising the first plurality of coupling structures and the second plurality of coupling structures, the path length and thus the electrical parameters of the various paths may be varied by varying the length of the coupling structures in order to provide asymmetric paths inside power module 100. In the examples of FIG. 2 The path lengths of first load paths $130_1$ to $130_4$ increase from left to right while the path lengths of second load paths $140_1$ to $140_4$ decrease from left to right. Within both plurality of first load paths 130 and plurality of second load paths 140, all path lengths thus differ from one another. The example of FIG. 2 accordingly provides the maximum level of asymmetry discussed above.

In the example of FIG. 3, like in the example of FIG. 2, first section $160_1$ and second section $160_2$ respectively comprise the first plurality of coupling structures and the second plurality of coupling structures. However, in the example of FIG. 3, the first plurality of coupling structures and the second plurality of coupling structures respectively have a meandering shape instead of being arranged in parallel as shown in FIG. 2. Meandering shape in the context of the present disclosure refers to the fact that the coupling structures of the first plurality of coupling shapes and the coupling structures of the second plurality of coupling shapes may extend alongside one another with bends while maintaining their separation. Based on the meandering shape, the path lengths of the paths of the plurality of first load paths and of the paths of the plurality of second load paths may be varied by some paths sharing at least part of their path length. As shown in FIG. 3 for example, the path length of first load path $130_2$ may include the path length of first load path $130_1$ and the path length of first load path $130_4$ may include at least a part of the path length of first load path $130_3$. Further, second load path $140_1$ may have the longest path length of plurality of second paths 140, which may be partially shared by second load path $140_3$, second load path $140_2$ and second load path $140_4$. Accordingly, within both plurality of first load paths 130 and plurality of second load paths 140, all path lengths differ from one another. The example of FIG. 3 therefore provides the maximum level of asymmetry discussed above.

Due to the meandering shape of first section $160_1$ and of second section $160_2$, the separation between first section $160_1$ and second section $160_2$ in FIG. 3 may in some examples of the present disclosure extend between segments of a path formed on first section $160_1$ or between segments of a path formed on second section $160_2$. An Example of the separation extending between segments of a path can be seen in the upper right corner of FIG. 3, where the separation between first section $160_1$ and second section $160_2$ extends between two segments of first load path $130_3$ formed on first section $160_1$. This extension of the separation into first section $160_1$ changes the capacitance value of first load path $130_3$ and thereby also the capacitance value of first load path $130_4$, which may thereby lead to a difference in capacitance value between first load paths $130_3$ and $130_4$ on the one hand and first load paths $130_1$ and $130_2$ on the other hand. More generally speaking, the meandering shape and the separation between first section $160_1$ and second section $160_2$ may be used to cause a difference in capacitance values between one or more of the various paths. To this end, the width of the separation between section $160_1$ and second section $160_2$ may also be varied, i.e. the width of the separation may in some examples of the present disclosure not be homogeneous as shown in FIGS. 2 to 4 but may vary sectionally.

In the example of FIG. 4, differing path lengths and thereby differing electrical parameters of the various paths are achieved based on the arrangements of switching devices $110_1$ to $110_4$ on first section $160_1$ and second section $160_2$ with regard to first module load terminal $T_{L1}$ and second module load terminal $T_{L2}$. As in the example of FIG. 3 the various paths may share at least part of their respective path lengths. As shown in FIG. 4, first load path $130_1$ may run along substantially the entire horizontal length of first section $160_1$ and thus has the longest path length. First load paths $130_2$ to $130_4$ may share a decreasing part of the horizontal length of first section $160_2$. Further, second load path $140_1$ may run along substantially the entire horizontal length of second section $160_2$ and thus has the longest path length. Second load paths $140_2$ to $140_4$ share a decreasing part of the horizontal length of first section $160_2$. In the example of FIG. 4, all path lengths within the corresponding plurality of paths again differ with regard to one another. The example of FIG. 4 therefore again provides the maximum level of asymmetry discussed above.

While the examples of FIGS. 2 to 4 illustrate varying the path lengths as well as the shapes of the plurality of first load paths 130 and of the plurality of second load paths 140, the same principles may be applied to the plurality of control paths 120. To this end, power substrate 160 may include a third section, on which plurality of control paths 120 may be formed at least in part. The third section may be separate from first section $160_1$ and second section $160_2$ in order to provide isolation between plurality of control paths 120, plurality of first load paths 130 and plurality of second load paths 140. Each control path of plurality of control paths 120 may have a path length along the third section. The path length of one control path of the plurality of control paths 120 may differ from the path lengths of the other control paths of the plurality of control paths 120 if an asymmetry is to be implemented in the plurality of control paths 120, e.g. as the sole asymmetry of power module 100 or in addition to an asymmetry in the other pluralities of paths of power module 100.

In some examples of power module 100, power module 100 may further comprise a control coupling structure having a plurality of control coupling paths In such examples, plurality of control coupling paths 120 may be formed at least in part on the control plurality of control coupling paths in addition to or instead of being at least partially formed on the third section of power substrate 160. At least one control coupling path of the plurality of control coupling paths may have a resistance differing from resistances of the other control coupling paths of the plurality of control coupling paths. Thus, asymmetric control paths may be provided based on varying resistance of the control coupling structure.

To further vary the electrical parameters of the various paths, first section $160_1$ second section $160_2$ and/or the third section may comprise at least one slit in order to vary the inductance value, the capacitance value and the resistance value of one or more paths and/or one or more of the various paths may include a resistive element and/or a capacitor in order to change the resistance value of one or more of the various paths.

In addition to causing different electrical parameters of paths based the path lengths, slits and discrete elements as discussed above, different electrical parameters of the various paths may also be caused based on the layout of the plurality of switching devices 110. For example, at least one switching device of the plurality of switching devices 110 may have a layout differing from the layout of the other switching devices of the plurality of switching devices 110. Based on the difference in layout, at least one path of the plurality of control paths 120, the plurality of first load paths 130 and the plurality of second load paths 140 may have at least one electrical parameter differing from the other paths of the corresponding plurality of paths.

The difference in electrical parameters between at least one path and the other paths of the corresponding plurality of paths caused by the various examples of the present disclosure discussed above leads to a reduction in ringing during switching of power module 100, as illustrated in FIGS. 5A to 6B.

Figure 5A:
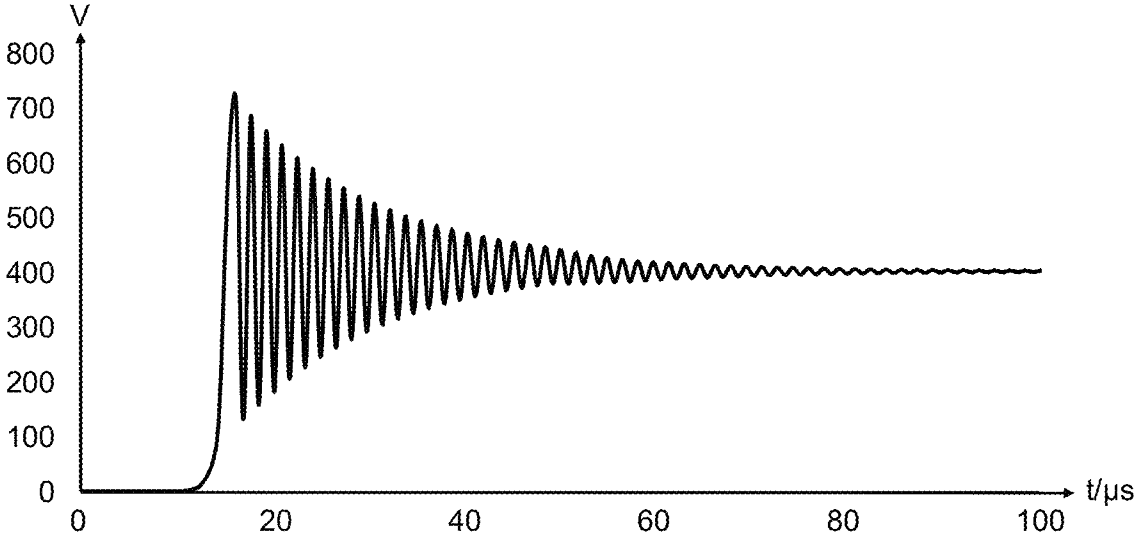
FIGS. 5A and 5B provide a comparison between a load path voltage during switching of a symmetric power module and a load path voltage during switching of an asymmetric power module according to examples of the present disclosure.
Figure 5B:
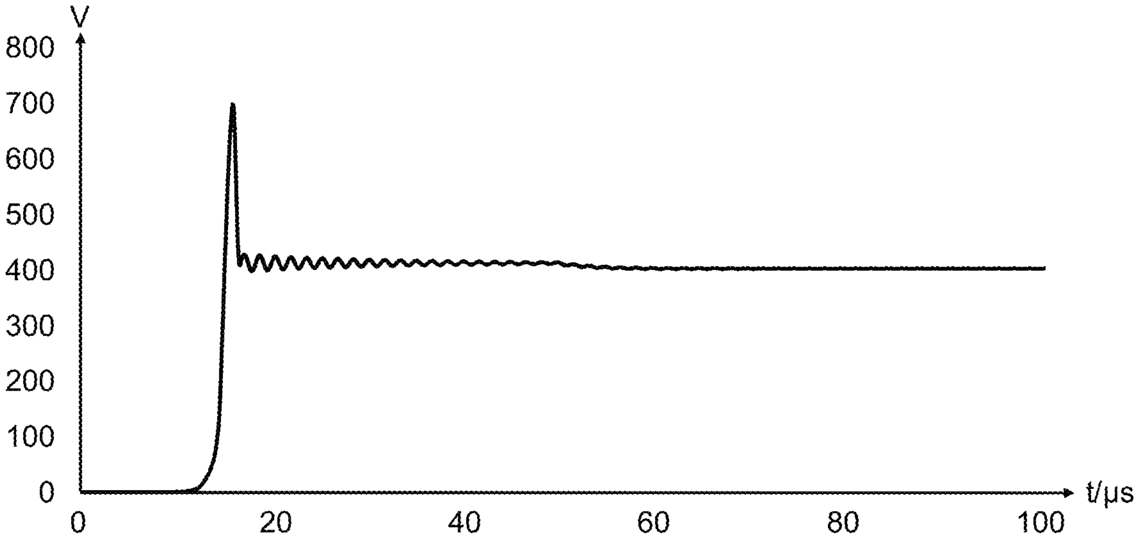

FIGS. 5A and 5B show a voltage between first module load terminal $T_{L1}$ and second module load terminal $T_{L2}$ during turn-off. FIG. 5A shows the voltage in case of a power module with paths having identical electrical parameters while FIG. 5B shows the voltage in case of power module 100 in accordance with the present disclosure. As can be seen, the voltage between first module load terminal $T_{L1}$ and second module load terminal $T_{L2}$ during turn-off of power module 100 exhibits very limited ringing compared to the power module with paths having identical electrical parameters.

Figure 6A:
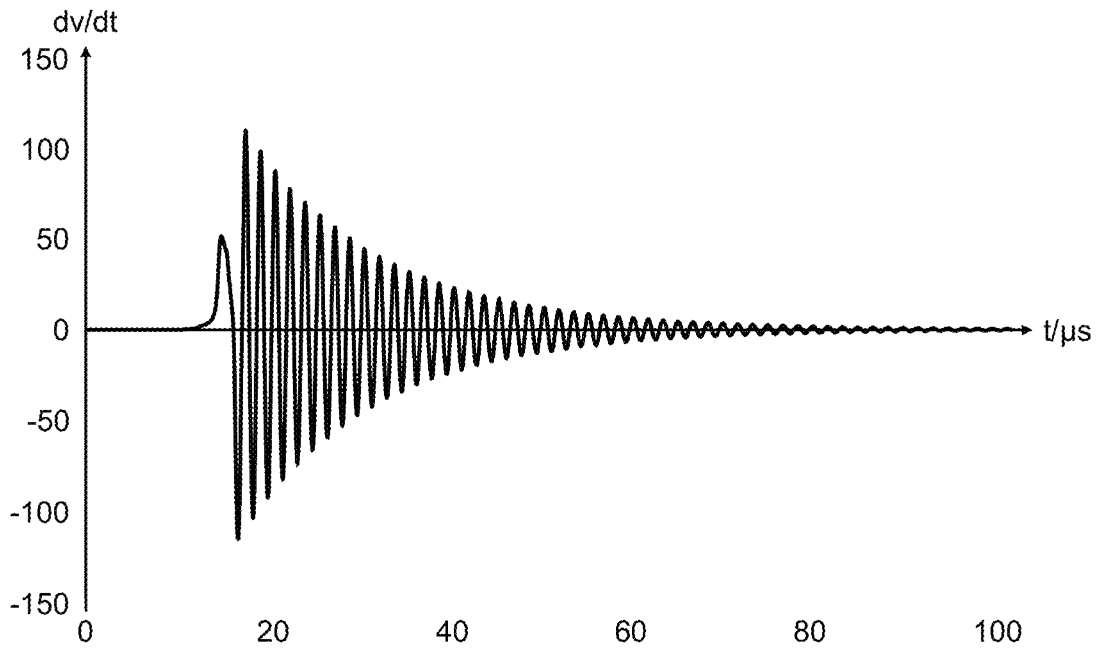
FIGS. 6A and 6B provide a comparison between a slew rate during switching of a symmetric power module and a slew rate during switching of an asymmetric power module according to examples of the present disclosure.
Figure 6B:
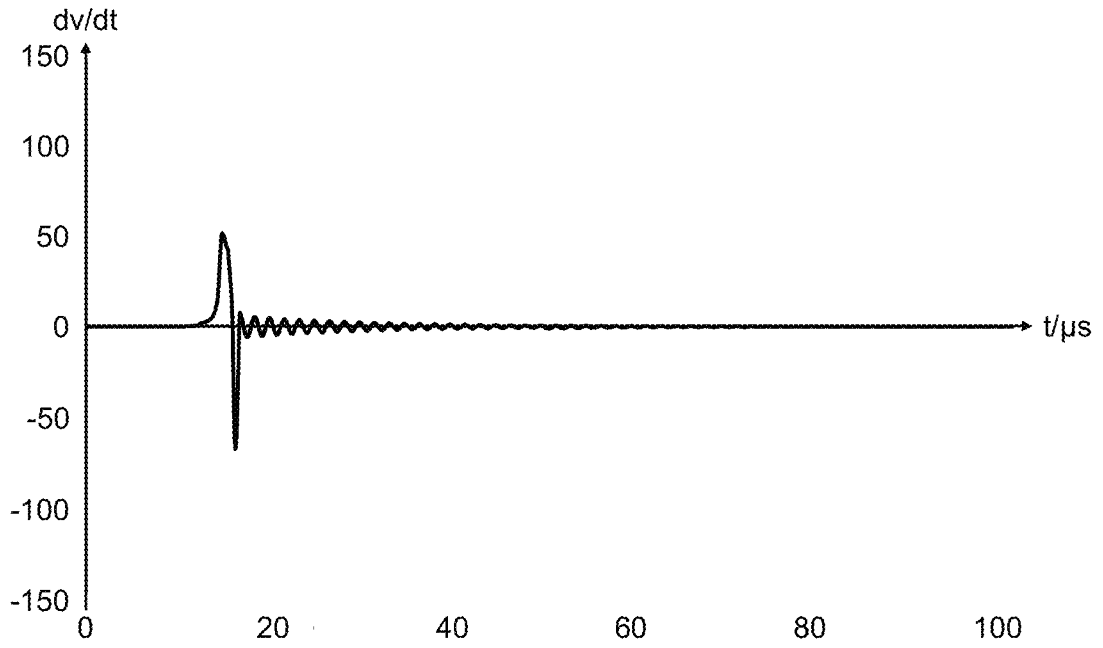

FIGS. 6A and 6B show a slew rate of the voltage between first module load terminal $T_{L1}$ and second module load terminal $T_{L2}$ during turn-off. FIG. 6A shows the slew rate in case of a power module with paths having identical electrical parameters while FIG. 6B shows the slew rate in case of power module 100 in accordance with the present disclosure. As can be seen, the slew rate in case of power module 100 exhibits very limited ringing compared to the power module with paths having identical electrical parameters.

The invention may further be illustrated by the following examples.

An example power module comprises a module control terminal, a first module load terminal and a second module load terminal and at least one power switch comprising a plurality of switching devices coupled in parallel, wherein each switching device comprises a control terminal, a first load terminal and a second load terminal, the control terminals of the plurality of switching devices are coupled to the module control terminal via a plurality of control paths, the first load terminals of the plurality of switching devices are coupled to the first module load terminal via a plurality of first load paths, the second load terminals of the plurality of switching devices are coupled to the second module load terminal via a plurality of second load paths, and at least one of a control path of the plurality of control paths, a first load path of the plurality of first load paths and a second load path of the plurality of second load paths has at least one electrical parameter respectively differing from the other control paths of the plurality of control paths, the other first load paths of the plurality of first load paths and the other second load paths of the plurality of second load paths.

In the example power module, the at least one electrical parameter may be at least one of a resistance, an inductance and a capacitance.

The example power module may further comprise a substrate layer, wherein the substrate layer may comprise a first section and a second section, the first section and the second section being separate from one another, wherein the plurality of first load paths is formed at least in part on the first section and the plurality of second load paths is formed at least in part on the second section, each path of the plurality of first load paths has a path length along the first section, each path of the plurality of second load paths has a path length along the second section, and at least one path length of at least one path of at least one of the plurality of first load paths and of the plurality of second load paths has a path length respectively differing from the path lengths of the other first load paths of the plurality of first load paths and of the other second load paths of the plurality of second load paths.

In the example power module, at least one of the first section and the second section may comprise at least one slit.

In the example power module, the first section may comprise a first plurality of coupling structures and the second section may comprise a second plurality of coupling structures, the first plurality of coupling structures and the second plurality of coupling structures respectively extending in parallel, the plurality of first load paths may at least in part be formed on the first plurality of coupling structures and the plurality of second load paths may at least in part be formed on the second plurality of coupling structures, and at least one coupling structure of at least one of the first plurality of coupling structures and the second plurality of coupling structures may have a length respectively differing from lengths of the other coupling structures of the first plurality of coupling structures and of the second plurality of coupling structures.

In the example power module, the first section may comprise a first plurality of coupling structures and the second section may comprise a second plurality of coupling structures, the first plurality of coupling structures and the second plurality of coupling structures respectively having a meandering shape, the plurality of first load paths may at least in part be formed on the first plurality of coupling structures and the plurality of second load paths may at least in part be formed on the second plurality of coupling structures, and at least one coupling structure of at least one of the first plurality of coupling structures and the second plurality of coupling structures may have a length respectively differing from lengths of the other coupling structures of the first plurality of coupling structures and of the second plurality of coupling structures.

In the example power module, the substrate layer may comprise a third section, the third section being separate from the first section and the second section, the plurality of control paths is formed at least in part on the third section, each path of the plurality of control paths may have a path length along the third section, and at least one path length of at least one path of at least one of the plurality of first load paths, of the plurality of second load paths and of the plurality of control paths may have a path length respectively differing from the path lengths of the other first load paths of the plurality of first load paths, of the other second load paths of the plurality of second load paths and the other control paths of the plurality of control paths.

In the example power module, at least one of a control path of the plurality of control paths, a first load path of the plurality of first load paths and a second load path of the plurality of second load paths may include at least one of a resistive element and a capacitor.

The example power module may further comprise a control coupling structure having a plurality of control coupling paths, each control coupling path corresponding to a control path of the plurality of control paths, wherein at least one control coupling path of the plurality of control coupling paths may have a resistance differing from resistances of the other control coupling paths of the plurality of control coupling paths.

In the example power module, at least one switching device of the plurality of switching devices may have a device layout differing from the other switching devices of the plurality of switching devices, the different device layout causing at least one of a control path of the plurality of control paths, a first load path of the plurality of first load paths and a second load path of the plurality of second load paths to have at least one electrical parameter respectively differing from the other control paths of the plurality of control paths, the other first load paths of the plurality of first load paths and the other second load paths of the plurality of second load paths.

The preceding description has been provided to illustrate an asymmetric power module. It should be understood that the description is in no way meant to limit the scope of the present disclosure to the precise embodiments discussed throughout the description. Rather, the person skilled in the art will be aware that the examples of the present disclosure may be combined, modified or condensed without departing from the scope of the present disclosure as defined by the following claims.

What is claimed is:

1. A power module, comprising:

a module control terminal, a first module load terminal, and a second module load terminal; and at least one power switch comprising a plurality of switching devices coupled in parallel, wherein:

each switching device of the plurality of switching devices comprises a device control terminal, a first load terminal, and a second load terminal, the device control terminals of the plurality of switching devices are coupled to the module control terminal via a plurality of control paths, the first load terminals of the plurality of switching devices are coupled to the first module load terminal via a plurality of first load paths, the second load terminals of the plurality of switching devices are coupled to the second module load terminal via a plurality of second load paths, and a control path of the plurality of control paths, or a first load path of the plurality of first load paths or a second load path of the plurality of second load paths has an electrical parameter that is respectively different from other control paths of the plurality of control paths, other first load paths of the plurality of first load paths, or other second load paths of the plurality of second load paths and is configured to reduce ringing during switching of the at least one power switch compared to the plurality of control paths, the plurality of first load paths, and the plurality of second load paths respectively having identical electrical parameters.

2. The power module of claim 1, wherein the electrical parameter is a resistance, an inductance, or a capacitance.

3. The power module of claim 1, further comprising a substrate layer, wherein:

the substrate layer comprises a first section and a second section separate from the first section;

the plurality of first load paths is formed by at least a portion of the first section and the plurality of second load paths is formed by at least a portion of the second section;

each path of the plurality of first load paths has a path length along the first section;

each path of the plurality of second load paths has a path length along the second section; and a path length of the first load path of the plurality of first load paths is different from path lengths of the other first load paths of the plurality of first load paths, or a path length of the second load path of the plurality of second load paths is different from path lengths of the other second load paths of the plurality of second load paths.

4. The power module of claim 3, wherein the first section or the second section comprises at least one slit.

5. The power module of claim 3, wherein:

the first section comprises a first plurality of coupling structures and the second section comprises a second plurality of coupling structures, the first plurality of coupling structures and the second plurality of coupling structures respectively extending in parallel;

the plurality of first load paths is at least in part formed on the first plurality of coupling structures and the plurality of second load paths is at least in part formed on the second plurality of coupling structures; and at least one coupling structure of at least one of the first plurality of coupling structures or the second plurality of coupling structures has a length respectively differing from lengths of other coupling structures of the first plurality of coupling structures or of the second plurality of coupling structures.

6. The power module of claim 3, wherein:

the first section comprises a first plurality of coupling structures and the second section comprises a second plurality of coupling structures, the first plurality of coupling structures and the second plurality of coupling structures respectively having a meandering shape;

the plurality of first load paths is at least in part formed on the first plurality of coupling structures and the plurality of second load paths is at least in part formed on the second plurality of coupling structures; and at least one coupling structure of at least one of the first plurality of coupling structures or the second plurality of coupling structures has a length respectively differing from lengths of other coupling structures of the first plurality of coupling structures or of the second plurality of coupling structures.

7. The power module of claim 3, wherein:

the substrate layer comprises a third section separate from the first section and the second section;

the plurality of control paths is formed at least in part on the third section;

each path of the plurality of control paths has a path length along the third section; and a path length of the first load path of the plurality of first load paths is different from path lengths of the other first load paths of the plurality of first load paths, or a path length of the second load path of the plurality of second load paths is different from path lengths of the other second load paths of the plurality of second load paths, or a path length of the control path of the plurality of control paths is different from path lengths of the other control paths of the plurality of control paths.

8. The power module of claim 1, wherein a control path of the plurality of control paths, a first load path of the plurality of first load paths, or a second load path of the plurality of second load paths includes at least one of a resistive element and a capacitor.

9. The power module of claim 1, further comprising a control coupling structure having a plurality of control coupling paths, each control coupling path corresponding to a control path of the plurality of control paths, wherein at least one control coupling path of the plurality of control coupling paths has a resistance differing from resistances of other control coupling paths of the plurality of control coupling paths.

10. The power module of claim 1, wherein at least one switching device of the plurality of switching devices has a different device layout from other switching devices of the plurality of switching devices, the different device layout configured to:

cause the control path of the plurality of control paths, or the first load path of the plurality of first load paths, or the second load path of the plurality of second load paths to have the electrical parameter that is respectively different from the other control paths of the plurality of control paths, the other first load paths of the plurality of first load paths, or the other second load paths of the plurality of second load paths.

11. The power module of claim 1, wherein the at least one power switch is configured to block voltages greater than 400 V.

12. The power module of claim 1, wherein the plurality of switching devices are silicon carbide (SiC) MOSFETs, silicon IGBTs, or gallium nitride (GaN) HEMTs.

13. A method of operating a power module comprising: a module control terminal, a first module load terminal, and a second module load terminal, and at least one power switch comprising a plurality of switching devices coupled in parallel, wherein each switching device of the plurality of switching devices comprises a device control terminal, a first load terminal, and a second load terminal, the device control terminals of the plurality of switching devices are coupled to the module control terminal via a plurality of control paths, the first load terminals of the plurality of switching devices are coupled to the first module load terminal via a plurality of first load paths, the second load terminals of the plurality of switching devices are coupled to the second module load terminal via a plurality of second load paths, and a control path of the plurality of control paths has a first electrical parameter different from other control paths of the plurality of control paths, or a first load path of the plurality of first load paths has a second electrical parameter different from other first load paths of the plurality of first load paths, or a second load path of the plurality of second load paths has a third electrical parameter different from other second load paths of the plurality of second load paths, the method comprising:

applying a switch control signal to the module control terminal; and applying, by the at least one power switch, a switching signal to the first module load terminal and the second module load terminal in response to applying the switch control signal, wherein the control path of the plurality of control paths, or the first load path of the plurality of first load paths, or the second load path of the plurality of second load paths having the electrical parameter that is respectively different from the other control paths of the plurality of control paths, the other first load paths of the plurality of first load paths, or the other second load paths of the plurality of second load paths reduces ringing in response to applying the switching signal compared to the plurality of control paths, the plurality of first load paths, and the plurality of second load paths respectively having identical electrical parameters.

14. The method of claim 13, further comprising applying power to a load coupled to the first module load terminal and the second module load terminal.

15. The method of claim 13, wherein the electrical parameter is a resistance, an inductance, or a capacitance.

16. The method of claim 13, wherein at least one switching device of the plurality of switching devices has a different device layout from other switching devices of the plurality of switching devices.

17. A power module, comprising:

a module control terminal, a first module load terminal, and a second module load terminal;

a power switch comprising a plurality of transistors coupled in parallel, each transistor having a control terminal, a first load terminal, and a second load terminal; and a substrate comprising: a first conductive structure forming a portion of a plurality of first load paths coupling the first load terminals of the plurality of transistors to the first module load terminal, and a second conductive structure forming a portion of a plurality of second load paths coupling the second load terminals of the plurality of transistors to the second module load terminal, wherein at least one of the plurality of first load paths has a different resistance, inductance or capacitance from other ones of the plurality of first load paths, or at least one of the plurality of second load paths has a different a different resistance, inductance or capacitance from other ones of the plurality of second load paths and is configured to reduce ringing during switching of the power switch compared to the plurality of first load paths and the plurality of second load paths respectively having identical resistance, inductance, and capacitance.

18. The power module of claim 17, wherein the substrate further comprises a third conductive structure forming a portion of a plurality of control paths coupling the control terminals of the plurality of transistors to the module control terminal.

19. The power module of claim 17, wherein the first conductive structure and the second conductive structure comprise copper.

20. The power module of claim 17, wherein at least one transistor of the plurality of transistors has a different device layout from other transistors of the plurality of transistors.

* * * * *